United States Patent [19]

Nakagawa et al.

[11] Patent Number: 4,801,489
[45] Date of Patent: Jan. 31, 1989

[54] PRINTED CIRCUIT BOARD CAPABLE OF PREVENTING ELECTROMAGNETIC INTERFERENCE

[75] Inventors: Katsuya Nakagawa, Kyoto; Kazumasa Eguchi, Higashiosaka; Fumio Nakatani, Higashiosaka; Shinichi Wakita, Higashiosaka; Hisatoshi Murakami, Higashiosaka; Tsunehiko Terada, Higashiosaka, all of Japan

[73] Assignees: Nintendo Co., Ltd., Kyoto; Tatsuta Electric Wire & Cable Co., Osaka, both of Japan

[21] Appl. No.: 25,106

[22] Filed: Mar. 12, 1987

[30] Foreign Application Priority Data

Mar. 13, 1986 [JP] Japan ................... 61-56714
Jun. 13, 1986 [JP] Japan ................... 61-138889
Jul. 8, 1986 [JP] Japan ................... 61-160364
Jul. 8, 1986 [JP] Japan ................... 61-160365

[51] Int. Cl.⁴ ............... B32B 3/00; B32B 31/00; H05K 9/00
[52] U.S. Cl. ................... 428/209; 428/546; 428/901; 427/96; 174/35 R; 174/35 MS; 174/36; 333/238; 156/297; 361/378; 361/402
[58] Field of Search ............ 428/209, 546, 901; 427/96; 174/35 R, 35 MS, 36; 333/238; 156/297; 361/398, 402

[56] References Cited

U.S. PATENT DOCUMENTS

| 4,130,723 | 12/1978 | Wakeling | 174/68.5 |
| 4,481,426 | 11/1984 | Nakagawa . | |
| 4,513,266 | 4/1985 | Ishihara | 333/238 |
| 4,514,586 | 4/1985 | Waggoner | 174/35 MS |
| 4,556,757 | 12/1985 | Oberbach | 174/35 R |
| 4,647,714 | 3/1987 | Goto | 174/36 |
| 4,658,334 | 4/1987 | McSparran et al. | 361/415 |
| 4,670,347 | 6/1987 | Lasik et al. | 428/458 |

Primary Examiner—Ellis P. Robinson
Assistant Examiner—P. J. Ryan
Attorney, Agent, or Firm—Larry A. Jackson

[57] ABSTRACT

A printed circuit board capable of preventing electromagnetic interference comprises a base plate composed of an insulating material. On the main surface of the base plate, a first electric conductive layer is formed by etching copper foil, which includes a signal electrode portion and a ground electrode portion. On the first electric conductive layer, an insulating layer such as a solder resist film is formed except for a part of the ground electrode portion, and on this layer, a second electric conductive layer is formed by screen-printing a copper ink so as to cover almost all of the first electric conductive layer. A part of the second electric conductive layer is connected to the ground electrode portion of the first electric conductive layer so that the second electric conductive layer acts as an electromagnetic shield. The copper ink is a mixture of copper powder, binder and other materials. A solder layer may be formed on the second electric conductive layer composed of the copper ink.

35 Claims, 5 Drawing Sheets

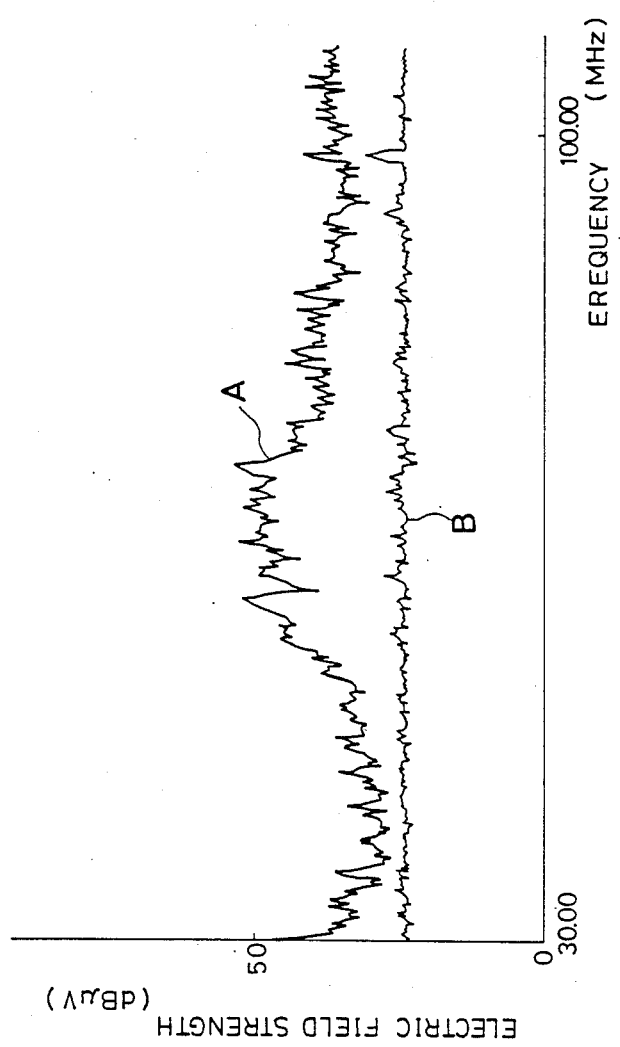

PRINTED CIRCUIT BOARD CAPABLE OF PREVENTING ELECTROMAGNETIC INTERFERENCE

BACKGROUND OF THE INVENTION

1. Field of the Invention

The present invention relates to a printed circuit board capable of preventing electromagnetic interference. More specifically, the present invention relates to a printed circuit board capable of preventing electromagnetic interference as part of the electronic circuitry, for example, a home TV game machine which is connected to other equipment by a cable and which handles high-frequency signals.

2. Description of the Prior Art

In recent years, FCC (Federal Communication Committee) regulations on electromagnetic interference have become strict in every country. One example of an apparatus which can prevent such an electromagnetic interference is disclosed, for example, in the Japanese Patent Laid-Open No. 72895/1983 laid open on May 15, 1983.

This prior art is very effective, for example, for personal computers and other self-standing equipment because a shield case is used to surround the whole unit. However, this is insufficient to prevent electromagnetic interference of home game machines, such as, the Family Computer (registered trademark). The reason is that the game machine's machine main unit is connected to other equipment, for example, a TV receiver or a controller, through a long cable. This means that the above-described prior art only prevents electromagnetic interference by confining electromagnetic energy in the shield case, is not effective in preventing electromagnetic waves radiated through the cable extending from the game machine.

In the Japanese Patent Laid-Open No. 8900/1981 laid open on Jan. 29, 1981, the Japanese Patent Laid-Open No. 20662/1984 laid open on Feb. 2, 1984, and the Japanese Patent Laid-Open No. 116437/1985 laid open on June 22, various shield plates or shield sheets are disclosed which are considered to be substitutes for the above-described shield case. However, a problem similar to that in the above-described shield case prior art remains even when such a shield plate or shield sheet is used.

In the Japanese Patent Laid-Open No. 4160/1982 laid open on Jan. 9, 1982, a semiconductor device, for example, a charge transferring device is disclosed. To prevent electromagnetic radiation from a high frequency signal generating circuit, an electric conductive layer is provided above the high frequency signal generating circuit with an insulating layer in between. This electrically conducting layer is held at a constant potential. In this prior art, electromagnetic radiation from a semiconductor chip itself is eliminated, but electromagnetic radiation from a printed pattern of a printed circuit board for mounting the chip, that is, from a signal electrode portion of the printed circuit, still can not be suppressed.

SUMMARY OF THE INVENTION

A principal objective of the present invention is to provide a printed circuit having a novel configuration which is capable of preventing electromagnetic interference.

Another objective of the present invention is to provide a printed circuit board capable of preventing electromagnetic interference by effectively suppressing spurious radiation of electromagnetic waves from a signal electrode portion of the printed circuit board.

A printed circuit board capable of preventing electromagnetic interference in accordance with the present invention is comprised of a first electrically conductive layer formed on at least one of the main surfaces of a base plate possessing a desired signal electrode portion and ground electrode portion, an insulating layer formed on the base plate, except for a part of the ground electrode portion, so as to cover the first electrically conductive layer, and a second electrically conductive layer formed on the insulating layer so as to cover a relatively wide area of the first electrically conductive layer, a part of which is connected to the ground electrode portion to act as an electromagnetic shield.

In the conventional printed circuit board having no second electrically conductive layer on the first electrically conductive layer, a stray capacity or a distributed capacity is formed between adjacent signal electrodes in the first electrically conductive layer. On the other hand, in the printed circuit board in accordance with the present invention, the second electrically conductive layer is formed on the first electrically conductive layer. Each signal electrode of the first electrically conductive layer forms a distributed capacity between the close second electrically conductive layer rather than between the adjacent signal electrodes. This second electrically conductive layer is connected to the ground electrode portion, thus being grounded in relation to high frequency components. Accordingly, spurious electromagnetic energy produced in each signal electrode of the first electrically conductive layer, for example, by induction flows to ground through the distributed capacity formed between the above-described second electrically conductive layer. Consequently, the spurious electromagnetic energy is eliminated in the printed circuit board itself.

In accordance with the present invention, spurious electromagnetic energy is reduced in the printed circuit board, itself constituting electronic circuitry. Therefore, even if a cable is connected to the board, no electromagnetic waves are radiated through that cable. Accordingly, the present invention is very effective for preventing electromagnetic interference in all types of electronic equipment. More specifically, in the conventional system for preventing electromagnetic interference using the shield case, spurious electromagnetic waves are radiated through a cable or the like extending from the printed circuit board itself or the electronic circuitry, But by employing the printed circuit board in accordance with the present invention, the spurious electromagnetic waves are eliminated in advance in the printed circuit board itself, and therefore spurious radiation can be prevented even when a cable or the like is connected.

The second electrically conductive layer is formed by printing copper ink. Accordingly, the second electrically conductive layer can be formed very simply in comparison with the case where the second electrically conductive layer is formed with copper foil. Accordingly, the rise in the cost of the printed circuit board itself is very slight.

The copper ink to be used is made by mixing and kneading metallic copper powder, resin mixture and fatty acid or its metallic salt. The resin mixture acts as a binder of metallic copper powder and other components. The fatty acid acts as a dispersant. Either a saturated fatty acid and unsaturated fatty acid may be used. Unsaturated fatty acid is preferable. A solvent of a reducing agent, an agent for adjusting coefficient of viscosity or the like may be added.

In one embodiment, the copper ink is made by blending 15-45 PHR in weight of a mixture of resol type phenol resin and p-tert-butyl phenol resin and 0.5-7 PHR in weight of unsaturated fatty acid or its alkali metallic salt with 100 PHR in weight of metallic copper powder. When such a copper ink is used, no deterioration of electric conductivity is caused due to oxidation, and the ink is stable with time.

For example, in the Japanese Patent Laid-Open No. 199778/1984 laid open on Nov. 12, 1984 and the Japanese Patent Laid-Open No. 156773/1985 laid open on Aug. 16, 1985, electrically conductive paints are disclosed. However, these conventional electrically conductive paints are not used for the printed circuit board, but are used to obtain an effect equivalent to the aforementioned shield case, shield plate or shield sheet by coating the housing portion. A printed circuit board in accordance with the present invention cannot be obtained by using these conventional paints.

In another embodiment, the copper ink is made by blending 15-50 PHR in weight of resin mixture (resin mixture composed of 20-60 weight percent of melamine resin and 80-40 weight percent of polyol and polyester resin and/or alkyd resin) and 1-8 PHR in weight of saturated fatty acid or unsaturated fatty acid or its metallic salt with 100 PHR in weight of metallic copper powder.

In still another embodiment, a metallic chelating agent and a soldering accelerating agent are added to the copper ink, and a solder layer is formed on the second electrically conductive layer formed by the copper ink. One example of the above-described copper ink is made by blending 1-8 PHR in weight of saturated fatty acid or unsaturated fatty acid or its metallic salt, 1-50 PHR in weight of metallic chelating agent and 0.1-2.5 PHR in weight of soldering accelerating agent with a total of 100 PHR in weight of 85-95 weight percent of metallic copper powder and 15-5 weight percent of resin mixture (resin mixture composed of 2-30 weight percent of metal surface activating resin and the rest of the thermosetting resin).

By using the copper ink having the above-described composition, the electric conductivity is improved, and a solder layer is easily applied to the whole surface of the cured copper ink layer.

These objects and other objects, features, aspects and advantages of the present invention will become more apparent from the following detailed description of the embodiments of the present invention when taken in conjunction with the accompanying drawings.

BRIEF DESCRIPTION OF THE DRAWINGS

FIG. 13 is a graph for explaining the effects of the embodiments in accordance with the present invention. The abscissa represents frequency and the ordinate represents the intensity of radiation electric field.

DESCRIPTION OF THE PREFERRED EMBODIMENTS

Figure 1:
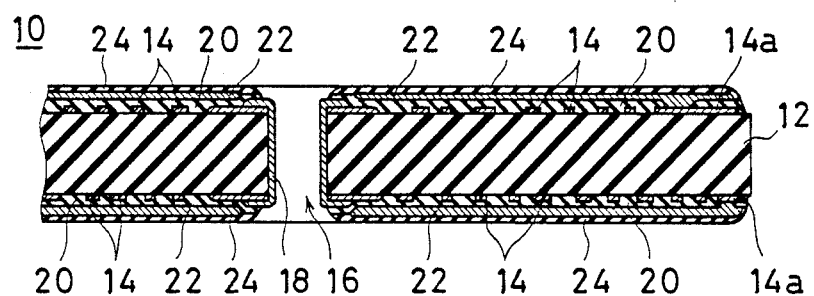
FIG. 1 is a cross-sectional view showing one embodiment in accordance with the present invention.

FIG. 1 is a cross-sectional view showing one embodiment in accordance with the present invention. A printed circuit board 10 includes a base plate 12 composed of an insulating material, for example, synthetic resin or ceramics. This base plate 12 is a double-sided board, and on each of the main surfaces of the base plate 12, an electrically conductive layer 14, the first electrically conductive layer, composed of copper foil, is formed. This electrically conductive layer 14 includes a circuit pattern portion having a signal electrode portion and a ground electrode portion 14a which are formed by etching.

A throughhole 16 is formed in the base plate 12, and a plating layer 18 is formed on the inner wall of this throughhole 16. This plating layer 18 is formed in the case where interconnection of the electrically conductive layers 14 on both surfaces of the base plate 12 is required. Both ends of the plating layer 18 are connected to the corresponding electrically conductive layers 14. In addition, the plating layer 18 may be unnecessary in the case where the throughhole 16 is used only for inserting parts (not illustrated).

A solder resist layer 20 is formed on each of the main surfaces of the base plate 12 so as to cover the electrically conductive layer 14, but except for a part of the ground electrode portion 14a. This solder resist layer 20 is formed where solder is not to adhere in the later process on the electric conductive layer 14. The solder resist layer 20 can also be utilized to secure insulation between the copper ink layer 22 as described later and the electrically conductive layer 14. Also, the copper ink layer 22 as described later is connected to the ground electrode portion 14a which is not covered by the solder resist layer 20.

On each of the main surface of the base plate 12, the copper ink layer 22, a second electrically conductive layer, is formed on the solder resist layer 20 over nearly the whole surface of the base plate 12 so as to cover the electrically conductive layer 14, and particularly to cover the signal electrode portion of electrically conductive layer 14. The copper ink forming this copper ink layer 22 may have, for example, the following composition.

To be brief, the copper ink is made by mixing metallic copper powder as a filler with a binder for firmly adhering the metallic copper powder to other materials. The particle size of metallic copper powder is smaller than the mesh size of the silk screen used in printing this copper ink layer 22. For the binder, a solvent of thermosetting synthetic resin, for example, phenol resin wherein electrolytic carriers are dispersed is used.

The specific resistance of such a copper ink layer 22 after curing is, for example, $10^{-3}$–$10^{-5}$ $\Omega\cdot$cm.

On the surface of the base plate 12, a solder resist layer 24, a second insulating layer, is formed so as to cover the copper ink layer 22.

The above-described copper ink layer 22 is effective as a measure for preventing electromagnetic interference. More specifically, the signal electrode portion of the electrically conductive layer 14 is located close to the copper ink layer 22, and therefore a stray capacity or distributed capacity is formed between the signal electrodes of the electrically conductive layer 14 and the copper ink layer 22 rather between the signal electrodes. Accordingly, spurious electromagnetic energy induced in the signal electrode of the electrically conductive layer 14 flows into the copper ink layer 22 through the formed distributed capacity. The copper ink layer 22 connected to the ground electrode portion 14a of the electrically conductive layer 14, is grounded in relation to high frequency components. Accordingly, the electromagnetic energy flowing into the copper ink layer 22 through the above-described distributed capacity eventually flows into high-frequency ground. Consequently, no spurious electromagnetic energy is stored in the signal portions of electrically conductive layer 14. Accordingly, even if an electronic circuit is made using the printed circuit board 10 and a cable or the like is connected thereto, no radiation energy is transferred through this cable.

Figure 11:
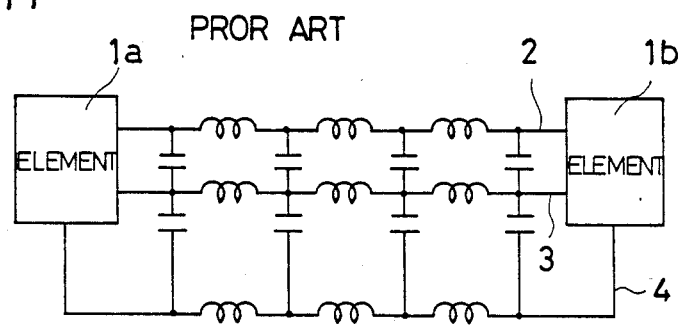
FIG. 11 and FIG. 12 are equivalent circuit diagrams for explaining the effects of the embodiments in accordance with the present invention.
Figure 12:
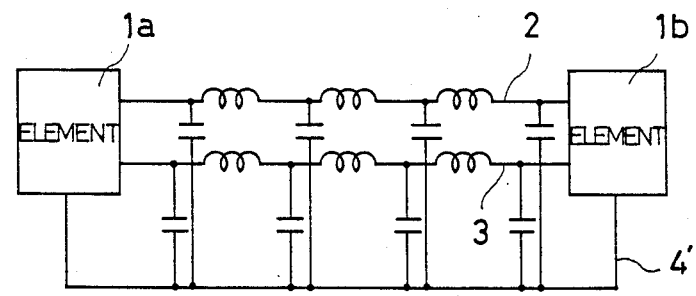

This is explained more specifically in reference to FIG. 11 and FIG. 12. FIG. 11 is an equivalent circuit diagram of a conventional printed circuit board, and in this equivalent circuit, signal electrodes 2 and 3 connecting elements 1a and 1b and a ground electrode 4, each having inductances according to their lengths and having distributed capacities according to the distance between the electrodes. These distributed capacities are formed between the signal electrodes 2 and 3 and between the signal electrodes 2 and 3 and the ground electrode 4. If the ground electrode 4 has an inductance component, the ground electrode 4 does not act as an ideal ground for a high-frequency component of the signal, a potential difference is produced between the both ends of the ground electrode 4 by this inductance, and energy by this potential difference remains on the ground electrode 4. When this remaining energy becomes large, it leaks outside as noise and produces electromagnetic interference with the surrounding electronic components and equipment.

On the other hand, in the printed circuit board of this embodiment, the equivalent circuit thereof is as shown in FIG. 12. The copper ink layer 22 and a ground electrode 4' covers nearly the whole surfaces of the signal electrodes 2 and 3. This ground electrode 4' thus does not contain an inductance component and no high-frequency potential difference is produced. Therefore there is little chance that energy remains in the ground electrode 4'.

Also, in the conventional printed circuit board, distributed capacities differ depending on the distance between the signal electrodes 2 and 3 and the ground electrode 4. The distributed capacity is thus non-uniform, and the impedance varies along the path of the signal. Therefore, mismatching of transmission of high frequency waves is produced. Consequently, the spurious electromagnetic energy in the signal stays on the signal electrodes 2 and 3, and this energy either leaks as noise to external electrodes or radiates away.

On the other hand, in the printed circuit board of this embodiment, the first electrically conductive layer 14 and the second electric conductive layer 22 are laminated through the insulating layer 20, which has nearly a uniform thickness. Therefore, the distance between each of the signal electrode 2 and 3 and the ground electrode 4' is nearly uniform, and the distributed capacity between them both is uniform. The distributed capacity thus becomes a large value to the extent that the distributed capacity between the signal electrodes 2 and 3 can be neglected. Accordingly, the electromagnetic energy which, conventionally, would have been stored in the signal electrodes 2 and 3 flows into the ground electrode 4' through that distributed capacity, and no spurious radiation takes place.

In FIG. 13, a line A shows the radiation level when the conventional printed circuit board is used, and a line B shows the radiation level when the printed circuit board of the embodiment in accordance with the present invention is used. As is understood from FIG. 13, in the conventional case, spurious radiation as large as 50.60 dBµV was produced at 67.03 MHz. On the other hand, in accordance with the present invention, the radiation level is almost the noise component alone. The regulations of FCC can thus be met.

Next, one example of a method of manufacturing the printed circuit board of FIG. 1 is described.

Figure 2:
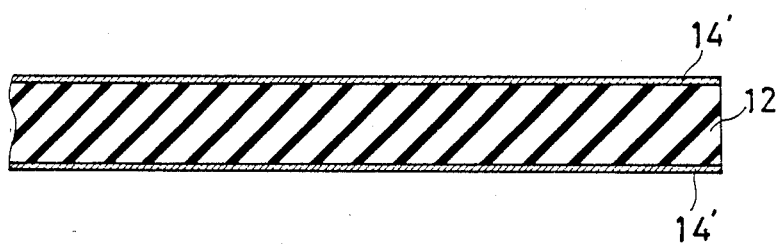
FIG. 2 through FIG. 7 are cross-sectional views showing one example of a method of manufacturing a printed circuit board of FIG. 1 embodiment in the sequence of production.

First, as shown in FIG. 2, the base plate 12 is prepared. This base plate 12 is made, for example, of synthetic resin, such as epoxy resin phenol, ceramics or the like with a thickness of for example, 1.2-1.6 mm. Then, on each of the main surfaces of the base plate 12, the electric conductive layer 14' is formed with copper foil with a thickness of between 30 to 70 µm, onto which is later placed a signal electrode pattern matching the circuit pattern of the first electrically conductive layer 14.

Figure 3:
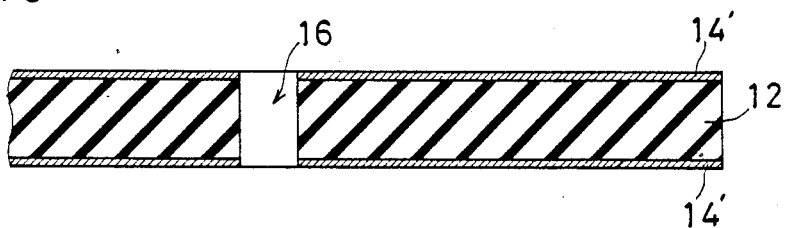

Subsequently, as shown in FIG. 3, the throughhole 16 is formed in the base plate 12 so as to penetrate the electric conductive layers 14', using for example, a multispindle drilling machine. This throughhole 16 is utilized to interconnect the electrically conductive layers 14' of both main surfaces, and can be also utilized as a hole for inserting leads of electronic parts. Then, the end faces of the drilled hole are ground. and the base plate 12 is transferred to the next process.

Figure 4:
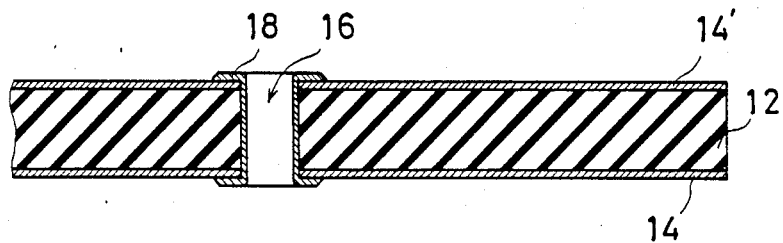

Next, as shown in FIG. 4, the plating layer 18 is formed on the inner wall of the throughhole 16, by, for example, electrolytic plating or chemical plating. Accordingly, the electrically conductive layers 14' on the both surfaces of the base plate 12 are connected to each other.

Figure 5:
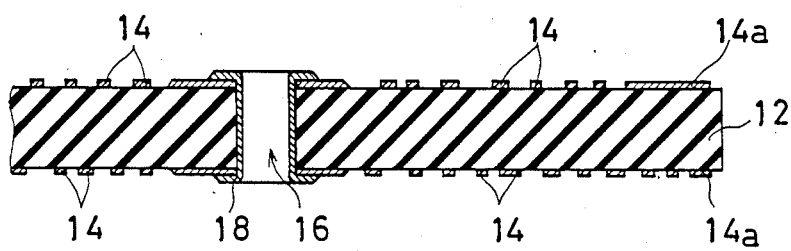

Subsequently, the electrically conductive layer 14' is etched to form the signal electrode portion according to the required circuit, including the ground electrode portion 14a as shown in FIG. 5. More specifically, etching resistant is first printed in accordance with the pattern of the required signal electrode, the throughhole 16 is filled, and wet etching or dry etching is then applied. The signal electrode portion and ground electrode portion are thus formed.

Figure 6:
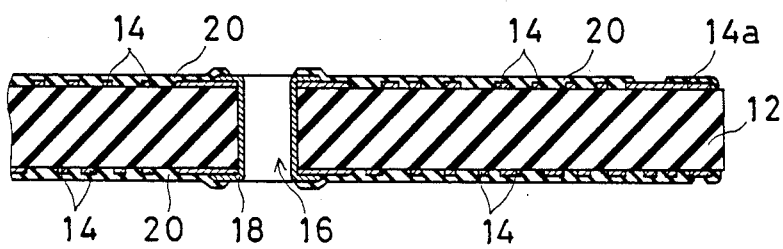

Thereafter, as shown in FIG. 6, the solder resist layer 20 which functions as the first insulating layer is printed. At this time, rust preventing treatment may be applied to prevent oxidation and deterioration of the electrically conductive layer 14.

The above processes are well known as general manufacturing processes of the conventional printed circuit board.

Figure 7:
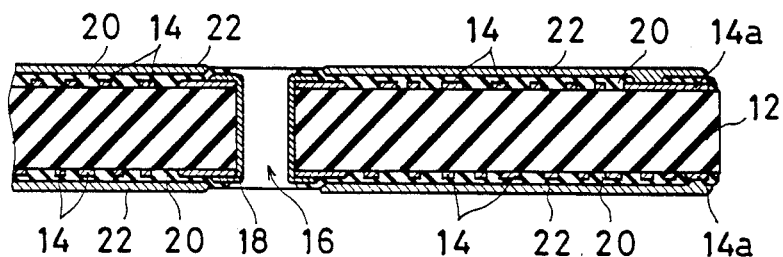

Next, as shown in FIG. 7, the copper ink layer 22 is formed on the first insulating layer, that is, the solder resist layer 20 over nearly the whole surface so as to cover the electrically conductive layer 14. To be detailed, a silk screen (not illustrated) having a printed pattern is required because the copper ink layer is deposited through the screen onto the main surface of the base plate 12.

In addition, when a copper ink having a sufficiently small specific resistance is used, the copper ink layer 22 may be formed so as to completely cover the ground electrode portion 14a.

Thereafter, the printed copper ink is cured by heating. Resin mixture used as a binder is of thermosetting type, and is cured by a condensation reaction when headed. In this curing, the copper ink layer 22 shrinks not only in the direction of the film surface but also in its thickness. In addition, the results of the experiment conducted by the inventors show that the strength of adhesion of the copper ink layer 22 after curing to the base plate 12, can withstand, for example, 3 kg of tensile load by with a 3φ land, being nearly equal to that of the electric conductive layer 14 composed of copper foil.

Finally, as shown in FIG. 1, the solder resist layer 24, a second insulating layer, is formed over the whole area of both surfaces of the base plate 12, by means of coating or printing, for example. Circuit board 10 is manufactured.

For the embodiment shown in FIG. 1 through FIG. 7, the copper ink is made by blending 15-45 PHR in weight of a mixture of resol type phenol resin and p-tert-butyl phenol resin and 0.5-7 PHR in weight of unsaturated fatty acid or its alkali metallic salt with 100 PHR in weight of metallic copper powder.

More preferably, the mixing ratio in weight of resol type phenol resin and p-tert-butyl phenol resin is 65:35-97:3.

The the degree of polymerization of p-tert-butyl phenol resin is preferably not more than 50.

Metallic copper power is preferably of a dendrite shape, and the average particle size is preferably 2-20 μm. For the specific example, the electrolytic copper powder "CE 1110A" manufactured by Fukuda Metal Foil & Powder Co., Ltd., and the "MF-D3" manufactured by Mitsui Mining & Smelting Co., Ltd. and etc. are listed.

In the copper ink of this embodiment, a mixture of resol type phenol resin and p-tert-butyl phenol resin acts as a binder, also acting effectively to maintain the electric conductivity for a long time period.

Normal resol type phenol resin can be used for this purpose. The above-described p-tert-butyl phenol resin is obtained by heat-polymerizing p-tert-butyl phenol and formalin under the presence of an alkali catalyst. The degree of polymerization is preferably not more than 50. When using a resin whose degree of polymerization exceeds 50, formation of the network structure of resol type phenol resin is hindered during the thermosetting of the copper ink. Thus contact between the metallic copper powder molecules cannot be obtained, resulting in a reduction in electric conductivity.

Also, the combining ratio of the binder composed of the above-described resin mixture is 15-45 PHR in weight, or preferably 20-40 PHR in weight, to 100 PHR in weight of metallic copper powder. When the binder is less than 15 PHR in weight, the amount of the binder is insufficient, resulting in poor fluidity of the copper ink obtained, reduced printability and increased copper powder oxidation. The net result is a reduction in the electric conductivity of the copper ink layer. When the amount of the binder exceeds 45 PHR in weight, the copper powder amount is insufficient, and the electric conductivity is reduced.

A mixture of 65-97 weight percent of resol type phenol resin and 35-3 weight percent of p-tert-butyl phenol resin is preferable. When p-tert butyl phenol resin exceeds 35 weight percent, the copper ink layer becomes brittle after thermosetting. Formation of the network structure of resol type phenol resin is thus hindered, contact between copper powder molecules cannot be obtained, and reduction in electric conductivity occurs. When p-tert-butyl phenol resin it is not more than 3 weight percent, the electric conductivity immediately after thermosetting is adequate, but the electric conductivity of the copper ink layer reduces with time.

Furthermore, unsaturated fatty acid or its alkali metallic salt acts as a dispersant and as a weak reducing agent to prevent oxidation of metallic copper powder, thereby contributing to the maintenance of electric conductivity. Specifically, the unsaturated fatty acid is absorbed on the surface of the copper powder, which accelerates dispersion of copper powder, thus resulting in a copper ink layer having high electric conductivity. Examples of unsaturated fatty acid are olein acid and linoleic acid. Examples of alkali metallic salt are sodium salt and potassium salt. Furthermore, vegetable oil containing not less than 60 weight percent of unsaturated fatty acid, for example, bean oil, sesame oil, olive oil or safflower oil can also be used. The amount of the vegetable oil added is 0.5-7 PHR in weight, preferably 2-6 PHR in weight to 100 PHR in weight of metallic copper powder. If less than 0.5 PHR in weight of vegetable oil is added dispersion of metallic copper powder in the binder becomes poor and the electric conductivity is reduced. If the vegetable oil added exceeds 7 PHR in weight, not only is there no improvement in dispersion corresponding to the added amount, but the electric conductivity of the copper ink layer is reduced.

Thus, a copper paste or copper ink used for this embodiment is obtained by mixing and kneading metallic copper powder, a binder composed of a specific resin mixture, and a dispersant composed of unsaturated fatty acid or its alkali metallic salt. In addition, a reducing agent conventionally used may be blended as desired.

Here, a more detailed description is made of the above-mentioned copper ink in comparison with other examples.

EMBODIED SAMPLES 1-12

Electrolytic copper powder having an average particle size of 3 μm, for example, the "CE1110A" manufactured by Fukuda Metal Foil & Powder Co., Ltd., resol type phenol resin, for example, the "PL2211", 58 percent in resin concentration, manufactured by Gunei Chemical Industry Co., Ltd., p-tert-butyl phenol resin and unsaturated fatty acid or its alkali metallic salt were mixed and kneaded in the composition shown in Table 1. The degree of polymerization of p-tert-butyl phenol resin (I) in Table 1 is 50 or less.

The copper ink samples 1-12 were screenprinted in a band shape of 2 mm in width and 35-45 μm in thickness between electrodes (intervals of 60 mm) on a glass-epoxy resin base plate. The sample underwent thermosetting at 150° C. for 60 minutes to form conductors (copper ink layers). The volume resistivity of the samples was measured using a digital multimeter. In order to ascertain whether or not t°e samples remained electrically conductive for a long time period of use, they were subjected to two kinds of oxidation acceleration tests. These tests were the humidity cabinet test (40° C. at 95% RH for 500 hours) and the heating test (100° for 500 hours). The rate of volume resistivity change (hereinafter referred to as "resistance change rate") was measured from the tests. Table 1 shows the results of the measurement.

In addition, calculations of the volume resistivity and the resistance change rate were performed according to equations (1) and (2).

Volume resistivity $(\Omega \cdot cm) = R \times t \times W/L$     (1)

where
R: Resistance value between electrodes ($\Omega$)
t: Thickness of coated film (cm)
W: Width of coated film (cm)
L: Distance between electrodes.

Resistance changing rate $(\%) = 100 \times (R_{500} - R_0)/R_0$     (2)

where
$R_0$: Resistance value before test ($\Omega$)
$R_{500}$: Resistance value after humidity cabinet test or heating test for 500 hours.

Furthermore, the printability of each sample was studied according to the following judging standard.
○: Good printability
△: Capable of printing
X: Incapable of printing
The results of the study are shown in Table 1.

COMPARATIVE SAMPLES 1-8

Mixtures having compositions as shown in Table 2 were prepared, conductors were formed on the base plates as with the embodied samples, and the volume resistivity was measured. The humidity cabinet test and the heating test were performed and the printability was also studied. Table 2 shows the results of the measurement and the study. In addition, p-tert-butyl phenol resin (II) in Table 2 contains 30 weight percent of p-tert-butyl phenol resin with a degree of polymerization exceeding 50.

COMPARATIVE SAMPLE 9

A copper ink composed of 100 PHR in weight of copper powder, 25 PHR in weight of resol type phenol resin, 4 PHR in weight of olein acid and 0.6 PHR in weight of organic titanium compound was prepared. The volume resistivity, the humidity cabinet test, the heating test and the printability were studied as in the embodied samples. The results of the study are shown in Table 2. In addition, tetra (2,2-diallyloxymethyl-1 butyl) bis [di(tridecil)]hosfitetinate was used as an organic titanium compound.

COMPARATIVE SAMPLE 10

A copper ink composed of 100 PHR in weight of copper powder, 25 PHR in weight of resol type phenol resin and 1.25 PHR in weight of anthracene as a reducing agent was prepared. And the volume resistivity, humidity cabinet test, heating test and the printability were studied as in the embodied samples. The results of the study are shown in Table 2.

As is apparent in the comparison of the results in Table 1 and Table 2, by blending p-tert-butyl phenol resin with the copper inks having the above-described compositions, conductor, that is, an electrically conductive layer capable of withstanding a long time period of use without adversely affecting the printability is obtainable. This result is particularly remarkable when the degree of polymerization of p-tert-butyl phenol resin is 50 or less. Furthermore, it is found that the effect is excellent within a mixing ratio range of 65:35-97:3 of resol type phenol resin and p-tert-butyl phenol resin. It is also obvious that when the amounts of binder and unsaturated fatty acid added to metallic copper powder are within ranges as shown in Table 1, excellent electric conductivity and a long time period of stability are obtainable.

On the other hand, the copper ink of the comparative sample 9 made by blending an organic titanium compound, as is obvious from the results of the humidity cabinet test and the heating test, cannot withstand a long time period of use. The copper ink of the comparative sample 10, made by blending anthracene has inferior values for initial volume resistivity, the resistance change rate after based on the humidity cabinet test and the resistance change rate based on the heating test.

In another embodiment, in order to form the copper ink layer 22, a copper ink is used which is made by blending 15-50 PHR in weight of resin mixture (resin mixture composed of 20-60 weight percent of melamine resin and 80-40 weight percent of polyol and polyester resin and/or alkyd resin) and 1-8 PHR in weight of saturated fatty acid, unsaturated fatty acid or its metallic salt with 100 PHR in weight of metallic copper powder.

More preferably, the blending ratio of polyester resin and/or alkyd resin and polyol is 95-50:5-50.

Metallic copper powder may have any shape: strip, branch, sphere or unfixed shape, and the particle size thereof is preferably less than 100 μm, and most preferably 1-30 μm. Metallic copper powder whose particle size is less than 1 μm is easily oxidized, and the electric conductivity of a coated film obtained is reduced. The blended amount of metallic copper powder used is always 100 PHR in weight.

The binder, that is, melamine resin in the resin mixture is alkyrated melamine resin. Either methylated melamine resin or butylated melamine is used. Melamine resin binds well to metallic copper powder and other components. The amount of melamine resin in the resin mixture blended with polyol and polyester resin and/or alkyd resin which are used as other binders is within a range of 20-60 weight percent, and preferably 30-50 weight percent. When the blended amount of melamine resin is less than 20 weight percent, enough metallic copper powder cannot be bound, and the network structure of melamine resin becomes unstable, and the electric conductivity of the copper ink layer is remarkably reduced. If the amount exceeds 60 weigh percent, the electric conductivity of the copper ink layer is remarkably reduced.

Polyol in the resin mixture is polyester polyol, and cross links with melamine resin.

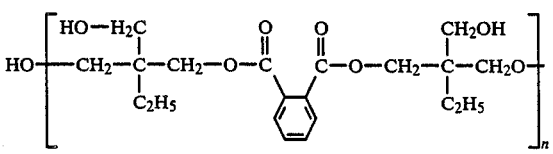

The total hydroxyl group value and acid value of the polyol used is 100 mg/g or more, and preferably 130 mg/g or more. Use of polyol with a total of hydroxyl group value and acid value is less than 100 mg/g causes the copper ink layer to lose electric conductivity.

The amount of polyol in the resin mixture blended with polyester resin and/or alkyd resin is within a range of 50-95 weight percent, and preferably 60-90 weight percent. When the blended amount of polyol is less than 50 weight percent, the electric conductivity of the copper ink layer is not good, and in reverse, when exceeding 95 weight percent, a good adhesion of the copper ink layer to the base plate cannot be obtained.

Polyester resin and/or alkyd resin in the resin mixture suppresses the condensation reaction of melamine resin and polyol, and improves the vehicular property of the copper ink layer.

The average molecular weight of polyester resin and/or alkyd resin used is preferably 5000 or more, and more preferably 8000 or more. When the average molecular weight is less than 5000, the adhesion of the copper ink layer to the base plate is remarkably reduced.

The amount of polyester resin and/or alkyd resin blended with polyol is within a range of 5-50 weight percent, and preferably 10-40 weight percent. When the blended amount of polyester resin and/or alkyd resin is less than 5 weight percent, the adhesion of the copper ink layer is not good, and in reverse, when exceeding 50 weight percent, electric conductivity of the copper ink layer is remarkably reduced.

The amount of polyol and polyester resin and/or alkyd resin in the resin mixture blended with melamine resin is within a range of 80-40 weight percent, and preferably 70-50 weight percent.

The blended amount of the binder, that is, the resin mixture (resin mixture composed of 20-60 weight percent of melamine resin and 80-40 weight percent of polyol and polyester resin and/or alkyd resin) is within a range of 15-50 PHR in weight and preferably 20-40 PHR in weight to 100 PHR in weight of metallic copper powder.

Saturated fatty acid, unsaturated fatty acid or metallic salt acts as a dispersant of metallic copper powder in the resin mixture. Saturated fatty acids such as palmitic acid, stearic acid, arachic acid, or acids having a carbon number of 16-20 are used. Unsaturated fatty acids such as zoomaric acid, olein acid, linolenic acid, or acids having a carbon number of 16-18 are used. Metallic salts of these acids may be sodium, potassium, copper, zinc, aluminum or the like.

The blended amount of saturated fatty acid, unsaturated fatty acid, or its metallic salt is within a range of 1-8 PHR in weight and preferably 2-6 PHR in weight to 100 PHR in weight of metallic copper powder. When the blended amount of dispersant is less than 1 PHR in weight, excessive kneading time is required to microdisperse metallic copper powder in the resin mixture, and in reverse, when exceeding 8 PHR in weight, the electric conductivity of the copper ink layer is reduced.

Furthermore, to adjust the coefficient of viscosity, a normal organic solvent can be used. For example, ethylene glycol meno ethyl ether acetate (ethyl cellosolve acetate) and ethylene glycol meno n-butyl ether acetate (n-butyl cellosolve acetate) are well known solvents.

Here, a more detailed description is made of the copper ink having the above composition in comparison with other examples.

Branched-shaped metallic copper powder having a particle size of 5-10 $\mu$m, stearic acid, olein acid and potassium oleinate as dispersants and melamine resin, polyester polyol, polyester resin and alkyd resin as the binding resin mixture were blended by the ratios (PHR in weight) as shown in Table 3. Some amount of n-butyl cellosolve acetate was added thereto as a solvent, and the mixture was kneaded by a three axle roll for 20 minutes to prepare the embodied samples 1-7. Five electric conductive lines of 2 mm in width, 30±5 $\mu$m in thickness and 100 mm in length were printed on a glass-epoxy resin base plate by screen printing. The copper ink was cured by heating to 130-180° C. for 10-60 minutes, and the volume resistivity, that is, the electric conductivity of the cured copper ink layer was measured.

To observe adhesive properties the copper-foil surface of a printed wire board underwent a cleaning treatment, and copper ink 50×50 mm$^2$ in area was printed on that copper-foil surface by screen printing. The copper ink was cured by heating as in the embodied samples, and parallel lines orthogonal to one another were then cut in the copper ink layer with intervals of 1 mm in accordance with the cross cut test, JIS (Japan Industrial Standards), test item K5400 (1979). Checker-shaped cuts were then made so that 100 squares formed in 1 cm$^2$ and the copper ink layer was then peeled from the copper-foil surface. Table 3 shows the results of the study on adhesion characteristics.

As is understood from Table 3, the embodied samples 1-7 excell in characteristics such as electric conductivity of the copper ink layer, that is, the volume resistivity, and the adhesion of the copper ink layer to the copper-foil surface.

However, comparative sample 1 contains large amounts of butylate melamine resin, polyester polyol and polyester resin, and therefore the electric conductivity and adhesion of the copper ink layer are reduced. Comparative example 2 has no electric conductivity at all because of the low hydroxyl group value of polyester polyol. For the comparative sample 3, the adhesion of the copper ink layer is not preferable because the average molecular weight of alkyd resin to be used is less than 5000. The comparative sample 4 contains a large amount of metallic copper powder and does not contain polyester resin and/or alkyd resin, and therefore the electric conductivity and adhesion of the copper ink layer are reduce.

Figure 8:
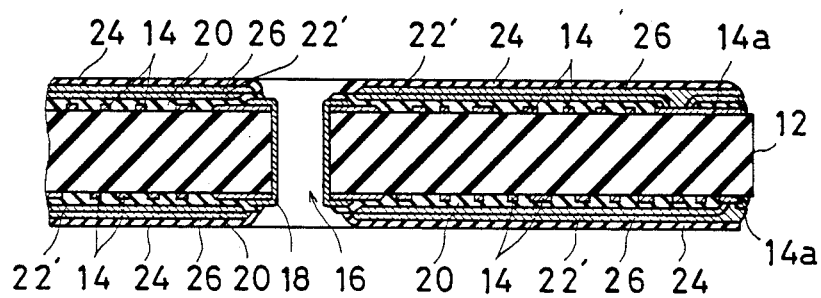
FIG. 8 is a cross-sectional view showing another embodiment in accordance with the present invention.

FIG. 8 is a cross-sectional view showing another embodiment in accordance with the present invention. In the previous embodiment, the copper ink layer 22 is effective for preventing electromagnetic interference. On the other hand, in this embodiment, the copper ink layer 22' and the solder layer 26 prevent electromagnetic interference.

To be detailed, the copper ink layer 22' is formed using the copper ink previously used, but when the binder is cured, a solderable layer is formed on the the surface of copper ink layer 22'. Then, the solder layer 26 is formed on copper ink layer 22' (solderable layer), the plating layer 18, the inner wall of the throughhole 16, and the electrically conductive layer 14, by solder dipping. This solder layer is formed on nearly the whole area of the main surface of the base plate 12 as was the solderable layer (copper ink layer) 22'. At this time, the solder resist layer 20 is removed on a segment of the ground electrode portion 14a, and the solder layer 26 is connected to that ground electrode portion 14a.

The solder layer 26 serves to reduce the specific resistance of the copper ink layer 22' (improves the electric conductivity) and to increase the mechanical strength. Assuming that the specific resistance of only the copper ink layer 22' after curing is, for example, about $10^{-4}\Omega\cdot cm$, the specific resistance becomes, for example, about $10^{-5}\Omega\cdot cm$ after the solder layer 26 has been formed. The copper ink layer 22' and the solder layer 26 can thus function together against electromagnetic interference.

Note that the solder layer 26 need only be formed to cover the copper ink layer 22', and not the signal electrode portion formed by copper foil (the electric conductive layer 14) or the plating layer 18.

On the surface of the base plate 12, solder resist layer 24 as the second insulating layer is formed as the second insulating layer so as to cover the solder resist layer 20 and the solder layer 26.

Figure 9:
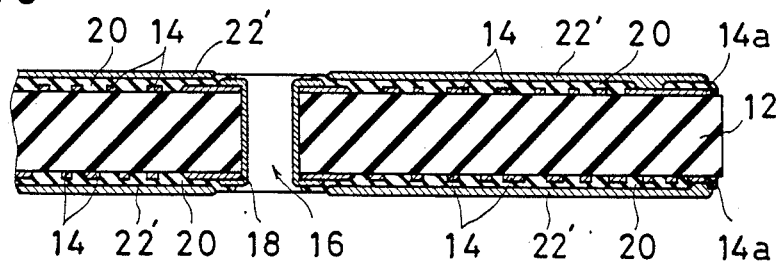
FIG. 9 and FIG. 10 are cross-sectional views showing a part of a method of manufacturing a printed circuit board of FIG. 8 embodiment.
Figure 10:
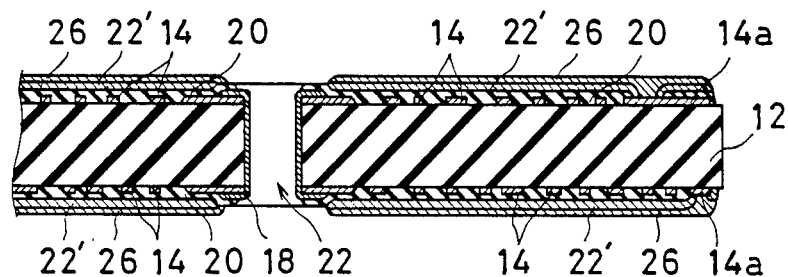

Next, one example of the method of manufacturing the printed circuit board of the embodiment shown in FIG. 8 through FIG. 10 is described.

The processes as shown in FIG. 2 through FIG. 6 are first employed for this embodiment. Then, after the process of FIG. 6, as shown in FIG. 9, the copper ink layer 22' is formed on nearly all of the first insulating layer, that is, the solder resist layer 20 and/or the electric conductive layer 14. To be detailed, a silk screen (not illustrated) having a printed pattern is used to print copper ink on the main surface of the base plate 12.

Thereafter, the printed copper ink is cured by heating cured. When the copper ink is cured, a solderable layer is formed on the surface thereof. This means that the surface of the copper ink layer 22' becomes solderable.

Thereafter, as shown in FIG. 10, the solder layer 26 is formed on all portions whereto solder actually adheres so as to cover at least the copper ink layer 22'. To be detailed, in this process of FIG. 10, solder is made to adhere on the main surface of the base plate 12 by means of solder leveller, reflow soldering or solder dipping.

As described above, this solder layer 26 mechanically reinforces the copper ink layer 22' and improves the electric conductivity.

Finally, as shown in FIG. 8, the solder resist layer 24, the second insulating layer, is formed on both surfaces of the base plate 12 by coating or printing. The printed circuit board is thus manufactured.

In the above-described embodiment, to form the solderable layer, a copper ink having a relatively low specific resistance is used. However, this solderable layer may be formed by an electrically conductive ink having low electric conductivity, or even an insulating ink having a specific resistance of, for example, about $10^6-10^8\Omega\cdot cm$. In summary, a solderable layer has only to be formed thereof because the solder layer 26 formed in the process thereafter has a sufficient electric conductivity. The copper ink 22' must be formed to completely cover the signal electrode portion because the solder layer 26 must be insulated from the signal electrode portion of electric conductive layer 14' by the copper ink layer 22'.

In the case where the solderable layer having insulating property is formed, it will be unnecessary to form the solder resist layer 20 as the first insulating layer because insulation between the solder layer 26 and the electric conductive layer 14 is provided by the solderable layer itself.

In the embodiment as shown in FIG. 8 through FIG. 10, a conductive copper ink having the following composition is utilized. To be described specifically, a copper ink is used which is made by blending 1-8 PHR in weight of saturated fatty acid, unsaturated fatty acid, or its metallic salt as a dispersant, 1-50 PHR in weight of metallic chelating agent and 0.1-2.5 PHR in weight of solder accelerating agent, with a total of 100 PHR in weight of 85-95% weight percent of metallic copper powder and 15-5 weight percent of resin mixture as a binder. For the resin mixture, a resin mixture composed of 2-30 weight percent of metal surface activating agent and the rest of thermosetting resin is used.

The metallic copper powder may be of any shape: strip, branch, sphere or unfixed shape, and the particle size thereof is preferably not more than 100 $\mu m$, and particularly 1-30 $\mu m$ is more preferable. Powder having a particle size of less than 1 $\mu m$ is easily oxidized, the electric conductivity of the copper ink layer is reduced, and the solderability is poor.

The amount of metallic copper powder blended with the binder, that is, the resin mixture is within a range of 85-95 weight percent, and preferably 87-93 weight percent. When the blended amount is less than 85 weight percent, the electric conductivity of the copper ink layer is reduced, the solder is brittle, the electric conductivity is reduced, and the screen-printability is poor.

For the metal surface activating agent in the resin mixture, at least one is selected from among denatured rosin such as active rosin, partially hydrofined rosin, fully hydrofined rosin, esterifined rosin, maleic, rosin, disproportional rosin and polymerized rosin. Active rosin or maleic rosin is preferable.

The blended amount of metal surface activating resin in the resin mixture is within a range of 2-30 weight percent, and preferably 5-10 weight percent. Even when the blended amount of metal surface activating resin is less than 2 weight percent, if the metallic chelating agent and the solder accelerating agent as described later are blended by proper amounts, soldering can be performed directly on the formed copper ink layer. By adding them within such a preferable range of blending, the soldered surface can be made smoother and glossier. When exceeding 30 weight percent, the electric conductivity of the copper ink layer is reduced and solderability is not increased.

Thermosetting resin in the resin mixture serves to bind metallic copper powder and other components, and has only to be a low-molecular substance being liquid at normal temperature that becomes a higher-molecular substance with thermosetting, and for example, phenol, acryl, epoxy, polyester or xylene resin may be used, but the use is not limited to these resins. Resol type phenol resin is preferable. The blended amount of thermosetting resin in the mixture is within a range of 98-70 weight percent.

The amount of the above-described binder, that is, resin mixture, blended with metallic copper powder is within a range of 15-5 weight percent, taking a total blended amount of metallic copper powder and resin mixture as 100 PHR in weight. When the blended amount of resin mixture is less than 5 weight percent, metallic copper powder is not bound sufficiently, the copper ink layer is brittle, the electric conductivity is reduced and the screen-printability is poor. In reverse, when exceeding 15 weight percent, the solderability is poor.

Saturated fatty acid, unsaturated fatty acid or its metallic salt acts as a dispersant. For a saturated fatty acid, palmitic acid, stearic acid, arachic acid, or an acid having a carbon number of 16-20 can be utilized. For an unsaturated fatty acid, zoomaric acid, olein acid, linolenic acid or an acid having a carbon number of 16-18 can be utilized. The metallic salt may be potassium, copper or aluminum. In the blend of metallic copper powder and resin mixture, the use of a dispersant accelerates microdispersion of metallic copper powder in the resin mixture, thus increasing electric conductivity.

The blended amount of saturated fatty acid, unsaturated fatty acid, or its metallic salt is within a range of 1-8 PHR in weight and preferably 2-6 PHR in weight to a total of 100 PHR in weight of metallic copper powder and resin mixture. When the blended amount of dispersant is less than 1 PHR in weight, excessive time is required to microdispersing metallic copper powder in the resin mixture, and in reverse, when exceeding 8 PHR in weight, the electric conductivity of the copper ink layer and the adhesion of the copper ink layer to the base plate are reduced.

For the metallic chelating agent, fatty amines such as monoethanolamine, diethanolamine, triethanolamine, ethylene diamine, triethylene diamine and triethylene tetramine are used. The metallic chelating agent prevents oxidation of metallic copper powder, thus improving the electric conductivity and the solderability. For example, a blend of metallic copper powder, thermosetting resin and metal surface activating resin, will result in poor solderability. But by adding the metallic chelating agent to the mix, a good solder can be obtained.

The blended amount of metallic chelating agent is within a range of 1-50 PHR in weight and preferably 5-30 PHR in weight to a total amount of 100 PHR in weight of metallic copper powder and resin mixture. When the blended amount of metallic chelating agent is less than 5 PHR in weight, the electric conductivity and the solderability are reduced. In reverse, when exceeding 50 PHR in weight, the viscosity of the copper ink is low and the solderability is reduced.

For the solder accelerating agent, at least one selected from among oxidicarboxylic acid, aminodicarboxylic acid and its metallic salts are used. For example, tartaric acid, maleic acid, glutamic acid, asparatic acid and its metallic salts may be used. The solder accelerating agent improves the solderability through synergism with the metallic chelating agent. By blending the metal surface activating resin, the metallic chelating agent and the soldering accelerating agent, the soldered surface of the copper ink layer can be made smoother and glossier.

The blended amount of solder accelerating agent is within a range of 0.1-2.5 PHR in weight, and preferably 0.5-2.5 PHR in weight, to a total of 100 PHR in weight of metallic copper powder and resin mixture. Even when the blended amount of soldering accelerating agent is less than 0.1 PHR in weight, it the metal surface activating agent and the metallic chelating agent are blended in proper amounts, soldering can be performed directly on the copper ink layer. But by setting the amount of solder accelerating agent within the preferable range, the soldered surface can be made smoother and glossier. In reverse, when exceeding 2.5 PHR in weight, the electric conductivity of the copper ink layer and the solderability are reduced.

To adjust the coefficient of viscosity, normal organic solvents such as diethylene glycol mono-n-butyl ether (n-butyl-carbitol), diethylene glycol-mono-butyl ether (n-butyl-carbitol acetate), ethylene glycol mono-n-butyl ether (n-butyl cellosolve), methyl isobutyl ketone, toluene, and xylene can be used.

Copper ink having the above composition is now compared with the various samples.

Branch-shaped metallic copper powder having particle sizes of 5-10 μm, a resin mixture (resin mixture consisting of 10 weight percent of maleic rosin and 90 weight percent of resol type phenol resin), potassium oleinate, oleinic acid, triethanolamine and glutamic acid were blended by the ratios (PHR in weight) as shown in Table 5, and of n-butyl-carbitol was added as a solvent. The mixture was kneaded for b 20 minutes by a three axle roll to prepare an embodied sample. A S-shaped pattern of 0.4 mm in width, 30±5 μm in thickness, and 520 mm in length was formed on a glassepoxy resin base plate by screen printing. The samples were then heated to 180° C. for 20-60 minutes to cure the copper ink.

Subsequently, in order to apply soldering to the formed copper ink layer, the base plate went through the solder leveller machine, was dipped in a flux bath for 4 seconds, dipped in a melted solder bath of 250° C. (Pb/Sn=40/60) for 5 seconds, blown by hot air of an atmospheric pressure of 2-6 and temperature of 220°-230° C., and cleaned. Soldering was then applied to the whole surface of the copper ink layer.

Table 5 shows the results of study on various characteristics of the copper ink layer obtained in the above-described process. In Table 5 and Table 6, polyester polyol (I) is of 280-300 mg/g in hydroxyl group value, not more than 4 mg/g in acid value and 1200 in average molecular weight, polyester polyol (II) is of 160-180 in hydroxyl group value, not more than 2 mg/g in acid value, and 2500 in average molecular weight, polyester polyol (III) is of 40-50 mg/g in hydroxyl group value, not more than 2 mg/g in acid value and 4100 in average molecular value, polyester resin is of 4-8 mg/g in hydroxyl group value not more than 5 mg/g in acid value and 18000 in average molecular weight, alkyd resin (I) is of 60 mg/g in hydroxyl group value, not more than 3 mg/g in acid value and 9800 in average molecular weight, and alkyd resin (II) is of 120 mg/g in hydroxyl group value, not more than 5 mg/g in acid value and 2200 in average molecular weight.

In Table 5 and Table 6, the observation of the soldered state of the copper ink layer was made with a low-magnification physical microscope, based on the following standards.

⊚ : Solder adheres to the whole area and has smooth and glossy surface.
○ : Solder has an uneven surface but adheres to the whole area.
△: The copper ink layer is partly exposed.
X: Solder adheres only partly.

The humidity cabinet test refers to the resistance change rate after the soldered copper ink layer has been left in an atmosphere of 55° C. and 95% RH for 1000 hours.

The heating test refers to the resistance change rate after the soldered copper ink layer has been heated at 80° C. for 1000 hours.

The film thickness of the solder layer on the copper ink layer of the embodied samples in Table 5 is 10 μm average. The embodied samples 1-8 have desired values regarding the volume resistivity of the copper ink layer (electric conductivity, adhesion of the copper ink layer, solderability onto the copper ink layer, and printability of the copper ink because the specific materials to be used for the copper ink are suitably blended.

Particularly, soldering can be performed directly on the copper ink layer using a normal organic acid flux agent, thus improving the electric conductivity from the order of $10^{-4}$ Ω·cm to the order of $10^{-5}$ Ω·cm. The electric conductivity of the copper ink layer on which the solder layer is formed has high heat resistance and moisture resistance and possesses a low resistance change rate. Therefore this invention can be used in an atmosphere of high temperature and high humidity.

In Table 6, comparative sample 1 contains a large amount of metallic copper powder and a small amount of thermosetting resin. Metallic copper powder is thus not bound sufficiently, the copper ink layer obtained is brittle, and it is difficult to print.

Comparative sample 2 contains a small amount of metallic copper powder, solder thus only partly adheres to the copper ink layer. Comparative sample 3 does not possess metallic salt of unsaturated fatty acid, and, therefore, the solderability is slightly reduced, and the resistance change rates in heat and moisture are increased. Comparative sample 4 has a large amount of an metallic salt of unsaturated fatty acid, and the adhesion of the copper ink layer to the base plate is thus poor. Comparative sample 5 does not possess the metallic chelating agent. The electric conductivity of the copper ink layer and its solderability are reduced, and the resistance change rates in heat and moisture are increased. Comparative sample 6 contains a large amount of metallic chelating agent, the coefficient of viscosity of the copper ink is thus reduced, resulting in difficulty in printing.

Comparative sample 7 does not possess the solder accelerating agent, but suitable amounts of metal surface activating resin and metallic chelating agent are blended, therefore the solderability is reduced only slightly. Comparative sample 8 contains a large amount of solder accelerating agent, the electric conductivity of the copper ink layer and the solderability are thus reduced.

In all of the above-described embodiment, the copper ink layer 22 (22') and the solder layer 26 as a shield against electromagnetic interference was formed on each of the both main surfaces of the base plate 12. However, the results of experiments conducted by the inventors et al. show that these layers may be formed on only one of the surfaces of the base plate 12.

Where the copper ink layer 22 (22') and the solder layer 26 were formed on both main surfaces of the base plate 12, the ground electrode portion 14a is formed on one of the main surfaces. Then, throughholes at several places are connected to ground and the copper ink layer 22 and the solder layer 26 from the opposite main surface are connected to those throughholes.

Although the present invention has been described and illustrated in detail, it is clearly understood that the same is by way of illustration and example only and is not to be taken by way of limitation, the spirit and scope of the present invention being limited only by the terms of the appended claims.

TABLE 1

| | COMPOSITION (PHR in weight) | | | | | | | | | |
|---|---|---|---|---|---|---|---|---|---|---|
| | | binder | | | dispersant | | | | | |
| embodied samples | metallic copper powder | resol type phenol resin | p-tert-butyl phenol resin (I) | resol type phenol resin/ p-tert-butyl phenol resin | olein acid | linoleic acid sodium | volume resistivity (Ω · cm) | resistance changing rate (%) by hummidity cabinet test | resistance changing rate (%) by heating test | printability |
| 1 | 100 | 14.5 | 0.5 | 97/3 | 0.5 | — | $5.4 \times 10^{-4}$ | 47 | 18 | O |
| 2 | 100 | 12 | 3 | 80/20 | 0.5 | — | $5.7 \times 10^{-4}$ | 42 | 16 | O |
| 3 | 100 | 10 | 5 | 67/33 | — | 0.5 | $5.5 \times 10^{-4}$ | 43 | 15 | O |
| 4 | 100 | 19 | 1 | 95/5 | 3 | — | $1.9 \times 10^{-4}$ | 34 | 15 | O |
| 5 | 100 | 17 | 3 | 85/15 | — | 3 | $2.2 \times 10^{-4}$ | 32 | 14 | O |
| 6 | 100 | 13 | 7 | 65/35 | 3 | — | $2.3 \times 10^{-4}$ | 36 | 15 | O |
| 7 | 100 | 29 | 1 | 97/3 | 5 | — | $1.3 \times 10^{-4}$ | 33 | 13 | O |
| 8 | 100 | 24 | 6 | 80/20 | 5 | — | $1.4 \times 10^{-4}$ | 33 | 14 | O |
| 9 | 100 | 20 | 10 | 67/33 | 5 | — | $1.3 \times 10^{-4}$ | 31 | 14 | O |
| 10 | 100 | 35 | 5 | 97/3 | 7 | — | $2.7 \times 10^{-4}$ | 36 | 13 | O |
| 11 | 100 | 38 | 7 | 84/16 | 7 | — | $2.7 \times 10^{-4}$ | 34 | 14 | O |
| 12 | 100 | 30 | 15 | 67/33 | — | 7 | $2.8 \times 10^{-4}$ | 37 | 13 | O |

TABLE 2

| | COMPOSITION (PHR in weight) | | | | | | | | | |
|---|---|---|---|---|---|---|---|---|---|---|
| | | binder | | | | | | resistance changing rate (%) by hummidity cabinet test | resistance changing rate (%) by heating test | |
| comparative samples | metallic copper powder | resol type phenol resin | p-tert-butyl phenol resin (I) | p-tert-butyl phenol resin (II) | resol type phenol resin/ p-tert-butyl phenol resin | dispersant olein acid | other materials | volume resistivity (Ω · cm) | | | printability |
| 1 | 100 | 15 | — | — | 100/0 | 0.5 | — | $4.9 \times 10^{-4}$ | >100 | >500 | Δ |
| 2 | 100 | 30 | — | — | 100/0 | 5 | — | $1.4 \times 10^{-4}$ | 154 | 62 | O |
| 3 | 100 | 24 | — | 6 | 80/20 | 5 | — | $9.7 \times 10^{-3}$ | >1000 | >500 | O |
| 4 | 100 | 35 | 15 | — | 70/30 | 5 | — | $1.2 \times 10^{-3}$ | >1000 | >500 | O |
| 5 | 100 | 20 | 20 | — | 50/50 | 4 | — | $3.3 \times 10^{-4}$ | 411 | 195 | O |
| 6 | 100 | 17 | 3 | — | 85/15 | 0.1 | — | $5.8 \times 10^{-3}$ | >1000 | >500 | O |
| 7 | 100 | 17 | 3 | — | 85/15 | 8 | — | $4.6 \times 10^{-4}$ | 376 | 158 | O |
| 8 | 100 | 10 | 3 | — | 100/13 | 5 | — | $1.5 \times 10^{-2}$ | >1000 | >500 | x |
| 9 | 100 | 25 | — | — | 100/0 | 4 | organic titanium compound (0.6) | $3.5 \times 10^{-4}$ | 150 | 350 | O |
| 10 | 100 | 25 | — | — | 100/0 | | anthracene | $1 \times 10^{-3}$ | 400 | 51 | O |

TABLE 2-continued

| | COMPOSITION (PHR in weight) | | | | | | | | resistance changing rate (%) by hummidity cabinet test | resistance changing rate (%) by heating test | print-ability |
|---|---|---|---|---|---|---|---|---|---|---|---|
| comparative samples | metallic copper powder | binder | | | | dispersant olein acid | other materials | volume resistivity ($\Omega \cdot$ cm) | | | |
| | | resol type phenol resin | p-tert-butyl phenol resin (I) | resol type phenol resin/ p-tert-butyl phenol resin (II) | | | | | | | |
| | | | | | | | (1.25) | | | | |

TABLE 3

| | COMPOSITION (PHR in weight) | | | | | | | | | | | | | |
|---|---|---|---|---|---|---|---|---|---|---|---|---|---|---|
| embodied samples | metallic copper powder | methlated melamine resin | butylated melamine resin | binder polyester polyol (I) | (II) | (III) | polyester resin | alkyd resin (I) | (II) | dispersant stearic acid | olein acid | olein acid potassium | volume resistivity ($\Omega \cdot$ cm) | adhesion |
| 1 | 100 | — | 8 | 16 | — | — | 1 | — | — | — | — | 4 | $8 \times 10^{-4}$ | 100/100 |
| 2 | 100 | — | 8 | 13 | — | — | 5 | — | — | — | — | 4 | $1 \times 10^{-4}$ | 100/100 |
| 3 | 100 | — | 8 | 9 | — | — | — | 9 | — | 3 | — | — | $3 \times 10^{-4}$ | 100/100 |
| 4 | 100 | 8 | — | 9 | — | — | 9 | — | — | — | 5 | — | $4 \times 10^{-4}$ | 100/100 |
| 5 | 100 | — | 3 | 11 | — | — | 1 | — | — | — | — | 1 | $6 \times 10^{-4}$ | 100/100 |
| 6 | 100 | — | 30 | 10 | — | — | 10 | — | — | — | — | 8 | $6 \times 10^{-4}$ | 100/100 |
| 7 | 100 | — | 8 | — | 13 | — | 5 | — | — | — | — | 4 | $1 \times 10^{-4}$ | 100/100 |

TABLE 4

| | COMPOSITION (PHR in weight) | | | | | | | | | | | | | |
|---|---|---|---|---|---|---|---|---|---|---|---|---|---|---|
| comparative samples | metallic copper powder | methlated melamine resin | butylated melamine resin | binder polyester polyol (I) | (II) | (III) | polyester resin | alkyd resin (I) | (II) | dispersant stearic acid | olein acid | olein acid potassium | volume resistivity ($\Omega \cdot$ cm) | adhesion |
| 1 | 100 | — | 40 | 20 | — | — | 10 | — | — | — | — | 4 | 10 | 50/100 |
| 2 | 100 | — | 8 | — | — | 13 | 5 | — | — | — | — | 4 | ∞ | 100/100 |
| 3 | 100 | — | 8 | 13 | — | — | — | — | 5 | — | — | 4 | $1 \times 10^{-3}$ | 30/100 |
| 4 | 100 | — | 3 | 8 | — | — | — | — | — | — | — | 4 | 10 | 80/100 |

TABLE 5

| | COMPOSITION (PHR in weight) | | | | | | | | | | | |
|---|---|---|---|---|---|---|---|---|---|---|---|---|
| embodied samples | metallic copper powder weight % | binder (resin mixture) weight % | dispersant olein acid potassium | olein acid | metallic chelating agent triethanol amine | soldering accelerating agent glutamic acid | volume resistivity ($\Omega \cdot$ cm) | resistance changing rate (%) by hummidity cabinet test | resistance changing rate (%) by heating test | adhesion | solder-ability | print-ability |
| 1 | 93 | 7 | 4 | — | 20 | 0.5 | $5 \times 10^{-4}$ | 10 | 8 | 100/100 | ◉ | ○ |
| 2 | 87 | 13 | 4 | — | 20 | 0.5 | $1 \times 10^{-4}$ | 6 | 4 | 100/100 | ◉ | ○ |
| 3 | 90 | 10 | — | 3 | 20 | 0.5 | $2 \times 10^{-4}$ | 6 | 7 | 100/100 | ◉ | ○ |
| 4 | 90 | 10 | 6 | — | 20 | 0.5 | $3 \times 10^{-4}$ | 5 | 6 | 100/100 | ◉ | ○ |
| 5 | 90 | 10 | 4 | — | 5 | 0.5 | $6 \times 10^{-4}$ | 7 | 8 | 100/100 | ◉ | ○ |
| 6 | 90 | 10 | 4 | — | 45 | 0.5 | $4 \times 10^{-4}$ | 10 | 7 | 100/100 | ◉ | ○ |
| 7 | 90 | 10 | 4 | — | 20 | 0.3 | $2 \times 10^{-4}$ | 8 | 5 | 100/100 | ◉ | ○ |
| 8 | 90 | 10 | 4 | — | 20 | 2.0 | $5 \times 10^{-4}$ | 11 | 9 | 100/100 | ◉ | ○ |

TABLE 6

| | COMPOSITION (PHR in weight) | | | | | | | | | | | |
|---|---|---|---|---|---|---|---|---|---|---|---|---|
| compara-tive samples | metallic copper powder weight % | binder (resin mixture) weight % | dispersant olein acid potassium | olein acid | metallic chelating agent triethanol amine | soldering accelerating agent glutamic acid | volume resistivity ($\Omega \cdot$ cm) | resistance changing rate (%) by hummidity cabinet test | resistance changing rate (%) by heating test | adhesion | solder-ability | print-ability |
| 1 | 98 | 2 | 4 | — | 20 | 0.5 | — | — | — | — | — | × |
| 2 | 75 | 25 | 4 | — | 20 | 0.5 | $7 \times 10^{-4}$ | — | — | 100/100 | × | ○ |
| 3 | 90 | 10 | — | — | 20 | 0.5 | $5 \times 10^{-4}$ | 57 | 51 | 100/100 | ○ | ○ |
| 4 | 90 | 10 | 10 | — | 20 | 0.5 | $8 \times 10^{-4}$ | 37 | 23 | 10/100 | ○ | ○ |
| 5 | 90 | 10 | 4 | — | — | 0.5 | $5 \times 10^{-3}$ | 75 | 59 | 100/100 | △ | ○ |
| 6 | 90 | 10 | 4 | — | 55 | 0.5 | — | — | — | — | — | × |
| 7 | 90 | 10 | 4 | — | 20 | — | $2 \times 10^{-4}$ | 7 | 8 | 100/100 | ○ | ○ |
| 8 | 90 | 10 | 4 | — | 20 | 3.0 | $1 \times 10^{-3}$ | 126 | 131 | 100/100 | △ | △ |

What is claimed is:

1. A printed circuit board constructed for preventing electromagnetic interference, comprising:
   a base plate having at least one electrically insulated main surface;
   a first electrically conductive layer formed on said electrically insulated main surface of said base plate, said first electrically conductive layer including a signal electrode portion and a ground electrode portion in accordance with a desired circuit pattern; and
   a second electrically conductive layer formed so as to cover said first electrically conductive layer and being electrically insulated from said signal electrode portion, said second electrically conductive layer connected to said ground electrode portion of said first electrically conductive layer so that electromagnetic energy generated in said signal electrode portion of said first electrically conductive layer is capacitively coupled to said second electrically conductive layer and from there passes into said ground electrode portion such that electromagnetic interference does not radiate from said printed circuit board.

2. A printed circuit board constructed for preventing electromagnetic interference in accordance with claim 1, further comprising an insulating layer formed on said base plate except for a part of said ground electrode portion of said first electrically conductive layer for insulating said signal electrode portion of said first electrically conductive layer from said second electrically conductive layer.

3. A printed circuit board constructed for preventing electromagnetic interference in accordance with claim 1 wherein said second electrically conductive layer is formed so as to cover nearly the whole area of said main surface of said base plate.

4. A printed circuit board constructed for preventing electromagnetic interference in accordance with claim 1, wherein said second electrically conductive layer includes a layer of material containing copper.

5. A printed circuit board constructed for preventing electromagnetic interference in accordance with claim 4, wherein said layer of material containing copper is formed by a copper ink which is made by mixing metallic copper powder, a binder and a dispersant.

6. A printed circuit board constructed for preventing electromagnetic interference in accordance with claim 5, wherein said binder is composed of a resin mixture including at least thermosetting resin.

7. A printed circuit board constructed for preventing electromagnetic interference in accordance with claim 5, wherein said dispersant includes saturated fatty acid or unsaturated fatty acid.

8. A printed circuit board constructed for preventing electromagnetic interference in accordance with claim 5, wherein said copper ink is made by blending 15-45 PHR in weight of a mixture of resol type phenol resin and p-tert-butyl phenol resin and 0.5-7 PHR in weight of unsaturated fatty acid or alkali metallic salt thereof with 100 PHR in weight of metallic copper powder.

9. A printed circuit board constructed for preventing electromagnetic interference in accordance with claim 8, wherein the blending ratio in weight of said resol type phenol resin and said p-tert-butyl phenol resin is 65:35-97:3.

10. A printed circuit board constructed for preventing electromagnetic interference in accordance with claim 8, wherein the degree of polymerization of said p-tert-butyl phenol resin is not more than 50.

11. A printed circuit board constructed for preventing electromagnetic interference in accordance with claim 5, wherein said copper ink is made by blending 15-50 PHR in weight of a resin mixture and 1-8 PHR in weight of saturated fatty acid or unsaturated fatty acid or metallic salt thereof with 100 PHR in weight of metallic copper powder.

12. A printed circuit board constructed for preventing electromagnetic interference in accordance with claim 11, wherein said resin mixture is composed of 20-60 weight percent of melamine resin and 80-40 weight percent of polyol and polyester resin and/or alkyd resin.

13. A printed circuit board constructed for preventing electromagnetic interference in accordance with claim 12, wherein the blending ratio in weight of said polyester resin and/or said alkyd resin and said polyol is 95-50:5-50.

14. A printed circuit board constructed for preventing electromagnetic interference in accordance with claim 1, wherein said second electrically conductive layer is solderable and further comprising a solder layer formed on said solderable second electrically conductive layer.

15. A printed circuit board constructed for preventing electromagnetic interference in accordance with claim 14, wherein said solderable second electrically conductive layer contains non-electrically conductive material that provides predetermined specific resistivity.

16. A printed circuit board constructed for preventing electromagnetic interference in accordance with claim 14, wherein said solderable second electrically conductive layer contains a dispersed electrically conductive material.

17. A printed circuit board constructed for preventing electromagnetic interference in accordance with claim 16, wherein said dispersed electrically conductive material includes copper powder.

18. A printed circuit board constructed for preventing electromagnetic interference in accordance with claim 17, wherein said solderable second electrically conducting layer is formed by a copper ink which is made by mixing metallic copper powder, resin mixture, saturated fatty acid or unsaturated fatty acid or metallic salt thereof and a metallic chelating agent.

19. A printed circuit board constructed for preventing electromagnetic interference in accordance with claim 18, wherein said copper ink further includes a soldering accelerating agent.

20. A printed circuit board constructed for preventing electromagnetic interference in accordance with claim 18, wherein said resin mixture is made by mixing metal surface activating resin and thermosetting resin.

21. A printed circuit board constructed for preventing electromagnetic interference in accordance with claim 18, wherein said copper ink is composed of a total of 100 PHR in weight of 85-95 weight percent of metallic copper powder and 15-5 weight percent of resin mixture, 1-8 PHR in weight of fatty acid or metallic salt thereof, 1-50 PHR in weight of metallic chelating agent and 0.1-2.5 PHR in weight of soldering accelerating agent.

22. A printed circuit board constructed for preventing electromagnetic interference in accordance with claim 18, wherein said resin mixture includes 2-30 weight percent of metal surface activating resin and the remainder being thermosetting resin.

23. A printed circuit board constructed for preventing electromagnetic interference in accordance with claim 14, wherein said solder layer is in electrical contact with said copper ink layer and said ground electrode portion.

24. A printed circuit board constructed for preventing electromagnetic interference in accordance with claim 1, wherein said base plate has an additional electrically insulated main surface and wherein additional said first and second electrically conductive layers are formed on said additional electrically insulated main surface.

25. A printed circuit board constructed for preventing electromagnetic interference in accordance with claim 1, further comprising an insulating layer formed on said base plate so as to cover said second electrically conductive layer.

26. A method of manufacturing a printed circuit board capable of preventing electromagnetic interference, comprising steps of:
(a) forming in accordance with a desired circuit pattern a first electrically conductive layer including a signal electrode portion and a ground electrode portion on at least one of the main surfaces of a base plate composed of an insulating material; and
(b) forming a second electrically conductive layer so as to cover said first electrically conductive layer and being electrically insulated from said signal electrode portion, said second electrically conductive layer connected to said ground electrode portion.

27. A method of manufacturing a printed circuit board capable of preventing electromagnetic interference in accordance with claim 26, wherein after forming said first electrically conductive layer and before forming said second electrically conductive layer, an insulating layer is formed on said base plate except for a part of said ground electrode portion, said ground electrode portion being exposed so that said second electrically conductive layer contacts said part of said ground electrode portion.

28. A method of manufacturing a printed circuit board capable of preventing electromagnetic interference in accordance with claim 26, wherein said step (b) includes a step of printing a copper ink made by mixing metallic copper powder, binder resin and a dispersant so as to cover said first electrically conductive layer and being electrically insulated from said signal electrode portion, and which further includes a step of curing said printed copper ink to form a copper ink layer as said second electrically conductive layer.

29. A method of manufacturing a printed circuit board capable of preventing electromagnetic interference in accordance with claim 28, wherein said binder resin includes at least thermosetting resin, and said step of curing said copper ink includes a step of heating said printed copper ink.

30. A method of manufacturing a printed circuit board capable of preventing electromagnetic interference in accordance with claim 26, further comprising the step of forming an insulating layer on said base plate so as to cover said second electrically conductive layer.

31. A method of manufacturing a printed circuit circuit board capable of preventing electromagnetic interference comprising steps of:

(a) forming in accordance with a desired circuit pattern a first electrically conductive layer including a signal electrode portion and a ground electrode portion on at least one of the main surfaces of a base plate composed of an insulating material;
(b) forming a second electrically conductive layer that is solderable so as to cover said first electrically conductive layer and being electrically insulated from said signal electrode portion, said second electrically conductive layer connected to said ground electrode portion; and
(c) forming a solder layer on said solderable second electrically conductive layer by means of soldering.

32. A method of manufacturing a printed circuit board capable of preventing electromagnetic interference in accordance with claim 31, wherein after forming said first electrically conductive layer and before forming said second electrically conductive layer, an insulating layer is formed on said base plate except for a part of said ground electrode portion, said ground electrode portion being exposed so that said second electrically conductive layer contacts said part of said ground electrode portion.

33. A method of manufacturing a printed circuit board capable of preventing electromagnetic interference in accordance with claim 31, further comprising the step of forming an insulating layer on said base plate so as to cover said solder layer.

34. A method of manufacturing a printed circuit board capable of preventing electromagnetic interference in accordance with claim 31, wherein said solder layer is in electrical contact with said copper ink layer and said ground electrode portion.

35. A method of manufacturing a printed circuit board capable of preventing electromagnetic interference, comprising the steps of:
(a) forming in accordance with a desired circuit pattern a first electrically conductive layer including a signal electrode portion and a ground electrode portion on at least one of the main surfaces of a base plate composed of an insulating material;
(b) forming a first insulating layer on said base plate except for a part of said ground electrode portion so as to cover said signal electrode portion of said first electrically conductive layer;
(c) forming a second electrically conductive layer so as to cover said first insulating layer, said second electrically conductive layer connected to said ground electrode portion of said first electrically conductive layer so that electromagnetic energy generated in said signal electrode portion of said first electrically conductive layer is capacitively coupled to said second electrically conductive layer and from there passes into said ground electrode portion such that electromagnetic interference does not radiate from said printed circuit board, said second electrically conductive layer being formed by the steps of:
(i) printing a copper ink made by mixing metallic copper powder, binder resin including at least a thermosetting resin, and a dispersant on said first insulating layer; and
(ii) curing said printed copper ink by heating to form a copper ink layer as said second electrically conductive layer; and
(d) forming a second insulating layer so as to cover said second electrically conductive layer.

* * * * *

UNITED STATES PATENT AND TRADEMARK OFFICE
CERTIFICATE OF CORRECTION

PATENT NO. : 4,801,489

DATED : January 31, 1989

INVENTOR(S) : Katsuya Nakagawa, et al

It is certified that error appears in the above-identified patent and that said Letters Patent is hereby corrected as shown below:

```
Column 1,    line 29, delete the comma after "as";
             line 31, delete "machine";
             line 36, delete the "," after "case" and insert --and--.
Column 2,    line 53, delete "," and replace it with --.--.
Column 3,    line  3, replace "and" with --or--.
Column 4,    line 21, delete the comma after "composed";
             line 39, delete "but".
Column 7,    line 16, replace "headed" with --heated--;
             line 27, add --Thus, the printed-- before "Circuit"
             and replace "Circuit" with --circuit--.
Column 9,    line  1, replace "t°e" with --the--;
             line 61, delete "And" and replace "the" with --The--.
Column 10,   line 31, replace "95-50:5-50" with --95:5-50:50--;
             line 41, replace "alkyrated" with --alkylated--.
Column 13,   line 29, delete "cured". (first occurrence)
Column 16,   line  9, delete "of";
             line 10, delete "b";
             line 63, add --)-- after "conductivity".
```

UNITED STATES PATENT AND TRADEMARK OFFICE
CERTIFICATE OF CORRECTION

PATENT NO. : 4,801,489

DATED : January 31, 1989

INVENTOR(S) : Katsuya Nakagawa, et al

It is certified that error appears in the above-identified patent and that said Letters Patent is hereby corrected as shown below:

Column 22, Claim 13, line 20, replace "95-5:5-50" with --95:5-50:50--.

Signed and Sealed this

Nineteenth Day of December, 1989

Attest:

JEFFREY M. SAMUELS

Attesting Officer     Acting Commissioner of Patents and Trademarks